United States Patent
Abouda et al.

(10) Patent No.: US 10,310,531 B2
(45) Date of Patent: Jun. 4, 2019

(54) CURRENT AND VOLTAGE REGULATION METHOD TO IMPROVE ELECTROMAGNETICE COMPATIBILITY PERFORMANCE

(71) Applicant: NXP USA, Inc., Austin, TX (US)

(72) Inventors: Pascal Kamel Abouda, Saint Lys (FR); Bertrand Vrignon, Plaisance du Touch (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/890,725

(22) Filed: Feb. 7, 2018

(65) Prior Publication Data

US 2019/0033903 A1 Jan. 31, 2019

(30) Foreign Application Priority Data

Jul. 28, 2017 (EP) ..................... 17306019

(51) Int. Cl.
*G05F 1/00* (2006.01)
*G05F 3/16* (2006.01)
*G05F 1/59* (2006.01)
*G05F 1/56* (2006.01)
*H03K 5/125* (2006.01)

(52) U.S. Cl.
CPC .............. *G05F 1/59* (2013.01); *G05F 1/56* (2013.01); *H03K 5/125* (2013.01)

(58) Field of Classification Search
CPC ................... G05F 1/59; H03K 5/125
See application file for complete search history.

(56) References Cited

U.S. PATENT DOCUMENTS 3,579,091 A * 5/1971 Clarke .................. H02M 3/137
323/282
4,005,353 A 1/1977 Yokoyama
(Continued)

FOREIGN PATENT DOCUMENTS

JP 6146506 A 3/1986

OTHER PUBLICATIONS

Zhou, Jungfeng et al. "An On-Chip Power Supply Regulator to Reduce the Switching Noise," IEEE Transactions on Electromagnetic Compatibility, /vol. 53, No. 1, Feb. 2011; pp. 157-168.
(Continued)

*Primary Examiner* — Kenneth B Wells (57) ABSTRACT

A current regulator circuit to improve electromagnetic compatibility performance operation of an IC device includes an input to receive a regulated voltage signal, an output to provide an output voltage at a desired voltage level, the output voltage exhibiting noise from a load, a first field effect transistor FET including a first source electrode coupled to the input, a first drain electrode coupled to the output, and a first gate electrode, a voltage clamp circuit coupled to the output, the voltage clamp circuit configured to conduct a varying current based upon the noise, a constant current source to provide a constant current, and a second FET including a second source electrode coupled to the output, a second drain electrode coupled to the constant current source and to the first gate electrode, and a second gate electrode coupled to the voltage clamp circuit to mirror the varying current in the second FET.

19 Claims, 3 Drawing Sheets

(56) References Cited

U.S. PATENT DOCUMENTS

| | | | |
|---|---|---|---|
| 5,629,655 A | 5/1997 | Dent | |
| 5,898,296 A * | 4/1999 | Maddox | G05F 1/56 |
| | | | 318/629 |
| 6,127,815 A * | 10/2000 | Wilcox | G05F 1/565 |
| | | | 323/282 |
| 6,441,594 B1 | 8/2002 | Connell et al. | |
| 8,692,529 B1 | 4/2014 | Wyatt | |

OTHER PUBLICATIONS

Morita, Glen, "Noise Sources in Low Dropout (LDO) Regulators," AN-1120 Application Note; Analog Devices; Jan. 1, 2011, pp. 781-329; XP055444698; <<http:www.analog.com/media/en/technical-documentation/application-notes/AN-1120.pdf>>.
European Search Report dated Feb. 6, 2018 for corresponding EP Application No. EP 17306019, 14 pages.

* cited by examiner

CURRENT AND VOLTAGE REGULATION METHOD TO IMPROVE ELECTROMAGNETICE COMPATIBILITY PERFORMANCE

CROSS REFERENCE TO RELATED APPLICATION(S)

The present application claims priority to EP Patent Application No. EP 17306019.5, entitled "CURRENT AND VOLTAGE REGULATION METHOD TO IMPROVE ELECTROMAGNETICE COMPATIBILITY PERFORMANCE," filed on Jul. 28, 2017, the entirety of which is herein incorporated by reference.

FIELD OF THE DISCLOSURE

This disclosure relates generally to electronic devices and methods, and more particularly to voltage regulators.

BACKGROUND

An integrated circuit (IC) device provides various electrical, signal processing, or data processing functions by integrating multiple electronic circuits onto a package, or die, based upon the design requirements of the IC device. For example, an IC device can perform digital logic operations, analog signal operations, or mixed signal (i.e., digital and analog) operations on a single IC device. In order to save power on an IC device, the operating voltages are typically selected at a minimum voltage level needed to ensure proper operation of the circuits of the IC device. As a result, the signal levels in an IC device are typically low, e.g., no larger than necessary, and therefore the IC device may be susceptible to various electromagnetic interference modes that can inject energy into the IC device, which can cause signals to have spurious signal levels on the IC device. The existence of spurious signals may result in faulty operation of the IC device. In particular, analog IC devices and mixed signal IC devices may be particularly susceptible to the ill effects of electromagnetic interference.

Electromagnetic interference can appear in an IC device as unwanted noise on the power rails of the IC device. Noise on a power rail of an IC device is particularly pernicious because a power rail is typically shared by multiple circuits of the IC device. A designer of an IC device can attempt to design each circuit on an IC device to be immune to the effects of power line noise, for example by designing a circuit with an improved power supply rejection ration (PSRR) by improving the ability of the circuit to maintain an output level in response to a noisy power rail. However, improvements to a circuit's PSRR are typically limited to a narrow operating bandwidth of the circuit and the IC device may remain susceptible to noise outside of this bandwidth, e.g., high frequency noise on the power rails. Moreover, following the approach of designing for improved circuit PSRRs, multiple circuits may need to be redesigned in order to mitigate the effects of noise on a particular power rail.

Another approach to reducing noise on the power rails of an IC device is to provide the power rails by one or more voltage regulators, either on the IC device itself, or external to the IC device. For example, a particular circuit of an IC device may be known to be particularly noisy, that is, that the circuit is known to be a source of noise injected onto the power rail for the circuit. Here, the designer can provide one voltage regulator for the noisy circuit, and can provide another voltage regulator for other circuits of the IC device, thereby isolating the other circuits from the ill effects of the noisy circuit. Further, by designing a voltage regulator between a noisy power source and the circuits of an IC device, the voltage regulator can function to isolate the circuits from the noisy power source. Also, by including multiple voltage regulators to an IC device at different voltage levels, the power supplied to the circuits of the IC device can be supplied at more optimal voltage levels based upon the characteristics of the particular circuits. However, the use of voltage regulators may not completely eliminate noise on the power rails of an IC device.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

An integrated circuit device according to the present disclosure includes a voltage regulator, a current regulator, and a load. The load may be characterized as introducing noise onto a signal of a power supply rail that is provided by the voltage regulator, for example, by rapidly changing the current demanded by the load, thus creating voltage swings on the power rail as circuits in the load are operated. Such noise on a power rail may couple adversely to other circuits of the integrated circuit device via radiated emissions to other power rails, cross-talk with other signal traces, or other coupling modes. Likewise, switching transients in the voltage regulator may cause voltage swings on the power rail that can adversely affect the operations of the circuits of the load.

The introduction of the current regulator between the voltage regulator and the load operates to isolate the voltage regulator and the load from each other, and to suppress noise on the power rail. In a particular embodiment, the current regulator includes a clamp circuit that clamps the output voltage at an output of the current regulator to a desired voltage level. Voltage swings can appear on the output of the current regulator due to switching transients in the load. When a current swing appears on the output of the current regulator, the current drawn by the clamp circuit increases. The changing current in the clamp circuit is mirrored to a current feedback circuit that is connected to the output of the current regulator to draw a small current from the output of the current regulator. A feedback signal from the feedback circuit is generated based upon the changing current in the feedback circuit. The feedback signal is provided to the gate of a power transistor that is connected in series between the voltage input of the current regulator and the voltage output of the current regulator.

In operation, when the clamp circuit detects a voltage at the output of the current regulator that is higher than the desired voltage level, the current in the clamp circuit increases and the mirrored current in the feedback circuit is likewise increased to draw down the voltage spike. Further, the feedback circuit operates to decrease the current provided from the voltage regulator. When the clamp circuit detects a voltage at the output that is lower than the desired voltage level, the current in the clamp circuit decreases. The mirrored current in the feedback circuit is likewise decreased, and the feedback circuit operates to increase the current provided from the voltage regulator to raise the voltage level at the output. In this way, noise on the output is suppressed, resulting in more reliable operations of the circuits of the load, and in less noise on the power rail.

Figure 1:
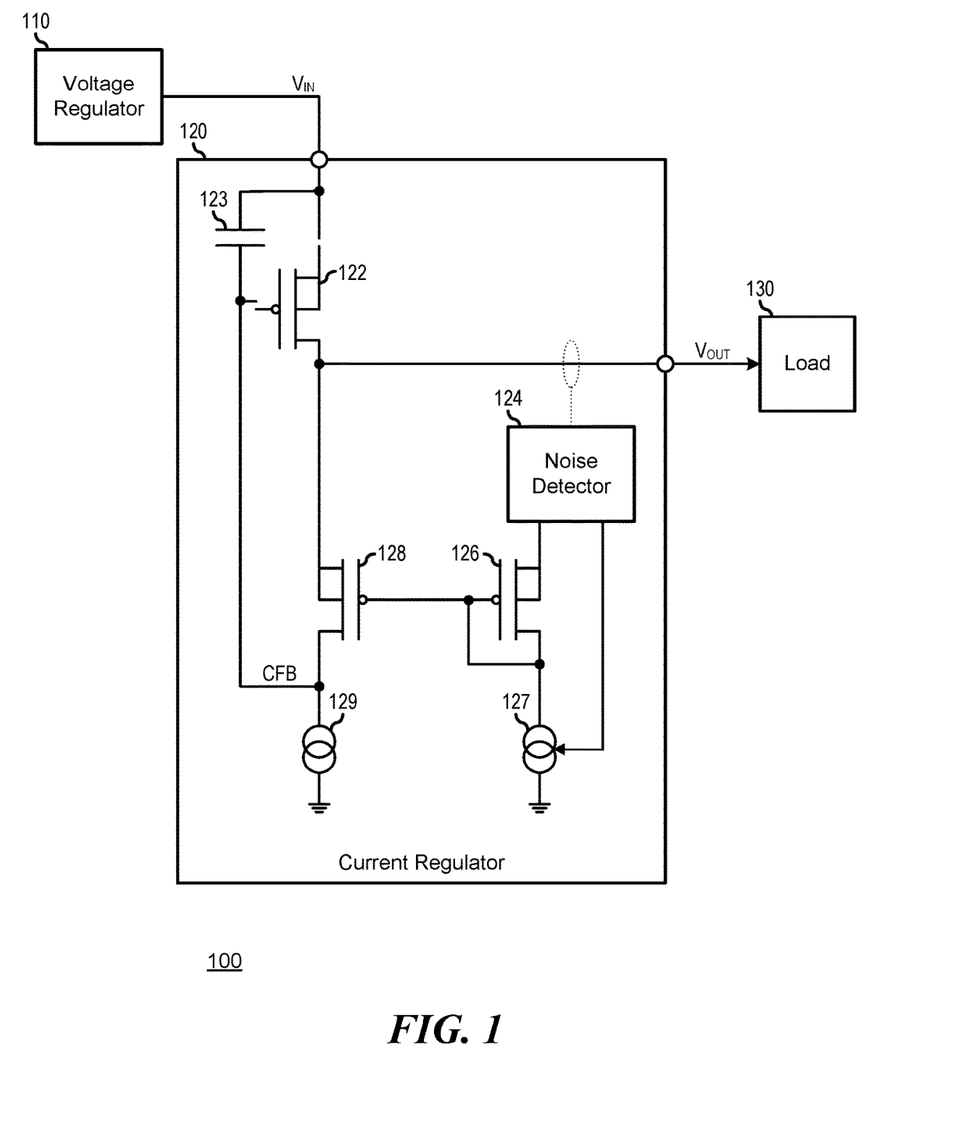
FIG. 1 is a block diagram illustrating an IC device that includes a current regulator according to a specific embodiment of the present application.

FIG. 1 illustrates an IC device 100 including a voltage regulator 110, a current regulator 120, and a load 130. IC device 100 represents a device for providing various electrical, signal processing, or data processing functions by integrating multiple electronic circuits onto a package, or die, based upon the design requirements of the IC device. For example, IC device 100 can perform digital logic operations, analog signal operations, or mixed signal (i.e., digital and analog) operations on a single IC device. Voltage regulator 110 includes an output connected to an input of current regulator 120. Current regulator 120 includes an output connected to an input of load 130. Voltage regulator 110 operates to provide a constant voltage $V_{IN}$ to a voltage input of current regulator 120, and to maintain the voltage in response to rapid changes in the current demand of the load. Voltage regulator 110 may represent one of several types of voltage regulation circuits, including linear regulator circuits, switching regulator circuits, or other regulator circuits, as needed or desired. Depending on the type of voltage regulator represented by voltage regulator 110, the voltage $V_{IN}$ may exhibit various noise components, such as voltage transients due to a noisy source voltage provided to the voltage regulator, noise induced by switching transients in the components of the voltage regulator, noise induced onto a power trace between the voltage regulator and current regulator 120, or other noise. Note that voltage regulator 110 may include a load feedback input that senses an output voltage level $V_{OUT}$ at a voltage output of current regulator 120, or that senses a load current drawn by load 130, and may provide the regulated voltage $V_{IN}$ based upon the feedback input, as is known in the art. As such, the details of operation and configuration of voltage regulator 110 will not be further disclosed herein, except as needed to illustrate the present disclosure.

Current regulator 120 includes PMOS FETs 122, 126 and 128, a capacitor 123, a noise detector 124, and current sources 127 and 129. PMOS FETs 122, 126, and 128 each include a source electrode, a gate electrode, and a drain electrode. The source electrode of PMOS FET 122 is connected to a first electrode of capacitor 123, and is connected to a voltage input of current regulator 120 to receive the input voltage $V_{IN}$ from voltage regulator 110. The gate electrode of PMOS FET 122 is connected to the second electrode of capacitor 123, and is connected to receive a current feedback signal CFB from the drain electrode of PMOS FET 128, as described below. The drain electrode of PMOS FET 122 is connected to a voltage output of current regulator 120 to provide the voltage $V_{OUT}$ to load 130. Noise detector 124 detects the noisy voltage $V_{OUT}$ on the voltage output and provides a control signal for regulating a bias current as described below. The source electrode of PMOS FET 126 is connected to an output of noise detector 124. The gate electrode of PMOS FET 126 is connected to the drain electrode of PMOS FET 126 to provide a current follower input signal to the gate electrode of PMOS FET 128, and the gate and drain electrodes of PMOS FET 126 are connected to current source 127. Current source 127 provides a variable current based upon the control signal from noise detector 124. The source electrode of PMOS FET 128 is connected to the drain electrode of PMOS FET 122, and the drain electrode of PMOS FET 128 is connected to current source 129.

Current regulator 120 constitutes a high performance isolator between the input voltage $V_{IN}$ and the output voltage $V_{OUT}$, operating to detect noise in the output voltage $V_{OUT}$ at the voltage output of the current regulator, and to isolate the input voltage $V_{IN}$ at the voltage input of the current regulator from the output noise. Note that $V_{IN}=V_{OUT} V_{DS}$, where $V_{DS}$ is the voltage drop across PMOS FET 122. Thus, in order to maintain $V_{IN}$ at a constant, that is, a noise-free, voltage level, the voltage drop across PMOS FET 122 $V_{DS}$ is modulated by current regulator 120 to compensate for noise in the output voltage $V_{OUT}$ at the voltage output of the current regulator. For example, if there is a voltage spike in the output voltage $V_{OUT}$, such that $V_{OUT2}>V_{OUT}$ then, in order maintain $V_{IN}$ at the desired voltage level, the voltage drop across PMOS FET 122 $V_{DS}$ must decrease, such that $V_{DS2}<V_{DS1}$. Similarly, if there is a voltage droop in the output voltage $V_{OUT}$, such that $V_{OUT2}<V_{OUT1}$, then, in order maintain $V_{IN}$ at a constant level, the voltage drop across PMOS FET 122 $V_{DS}$ must increase, such that $V_{DS2}>V_{DS1}$. As such, current regulator 120 operates to modulate the voltage drop across PMOS FET 122 in response to the detected noise in the output voltage $V_{OUT}$ at the voltage output of current regulator 120. In this way, the input voltage $V_{IN}$ is less noisy than the output voltage $V_{OUT}$, and less noise is propagated to other elements of IC device 100, or to other devices external to the IC device. Thus, current regulator 120 is particularly useful with digital circuits, where switching transients may produce large inrush currents and voltage drops when the digital circuits switch on, and large current drops and voltage spikes when the digital circuits switch off.

Noise detector 124 detects noise on the output voltage $V_{OUT}$ at the voltage output of current regulator 120. When no noise is detected on the output voltage $V_{OUT}$, a small bias current (approximately 2 µA) is provided by current source 129 through PMOS FET 128. The bias current is mirrored in PMOS FET 126, and the current in current source 127 is equal to the current in current source 129.

Then, when noise is detected on the output voltage $V_{OUT}$, noise detector 124 produces a control signal that varies the current level of current source 127. The varying current of current source 127 is drawn through PMOS FET 128, and is mirrored in PMOS FET 128. However, because current source 129 is a constant current source, the changing current in PMOS FET 128 is provided as a current feedback signal CFB to PMOS FET 122 to modulate the voltage drop across PMOS FET 122.

For example, when noise detector 124 detects a voltage spike in the output voltage $V_{OUT}$ to a higher level than the nominal voltage level, the control signal from noise detector 124 causes the current in current source 127 to increase, resulting in an increase in the current through PMOS FET 126. The increased current through PMOS FET 126 is mirrored in PMOS FET 128. Because the current in PMOS FET 128 is higher than the bias current provided by current source 129, and the excess current is provided in the current feedback signal CFB to capacitor 123, which causes a rise in a voltage at the gate of PMOS FET 122, thereby reducing voltage across PMOS FET 122 $V_{DS}$, and thereby isolating the input voltage $V_{IN}$ from the voltage spike on the output voltage $V_{OUT}$. Similarly, when noise detector 124 detects a voltage droop in the output voltage $V_{OUT}$ to a lower level than the nominal voltage level, the control signal from noise detector 124 causes the current in current source 127 to decrease, resulting in a decrease in the current through PMOS FET 126. The decreased current through PMOS FET 126 is mirrored in PMOS FET 128. The current in PMOS FET 128 is lower than the bias current provided by current source 129, and the deficiency in the current is provided from capacitor 123 to the current feedback signal CFB, which causes a fall in a voltage at the gate of PMOS FET 122, thereby increasing voltage across PMOS FET 122 $V_{DS}$, and thereby isolating the input voltage $V_{IN}$ from the voltage droop on the output voltage $V_{OUT}$.

In a particular embodiment, an IC device includes a current regulator similar to current regulator 120 and a load similar to load 130, but a voltage regulator similar to voltage regulator 110 is provided as an external device to the IC device. Here, a voltage from the voltage regulator is provided to a voltage supply input pin on the package of the IC device that connects the input voltage $V_{IN}$ to an input of the current regulator. In another embodiment, an IC device includes only a load, and an external device includes a voltage regulator similar to voltage regulator 110 and a current regulator similar to current regulator 120. Here, an output voltage $V_{OUT}$ from the current regulator is provided to a voltage supply input pin on the package of the IC device that connects the output voltage $V_{OUT}$ to a load of the IC device. In this embodiment, the size of any decoupling capacitors provided at the IC device may be of a reduced capacitance. Further, in a similar embodiment, a voltage regulator and a current regulator may be configured as separate components, or may be provided as a single component that receives a supply voltage and provides the output voltage $V_{OUT}$ as an output.

Figure 2:
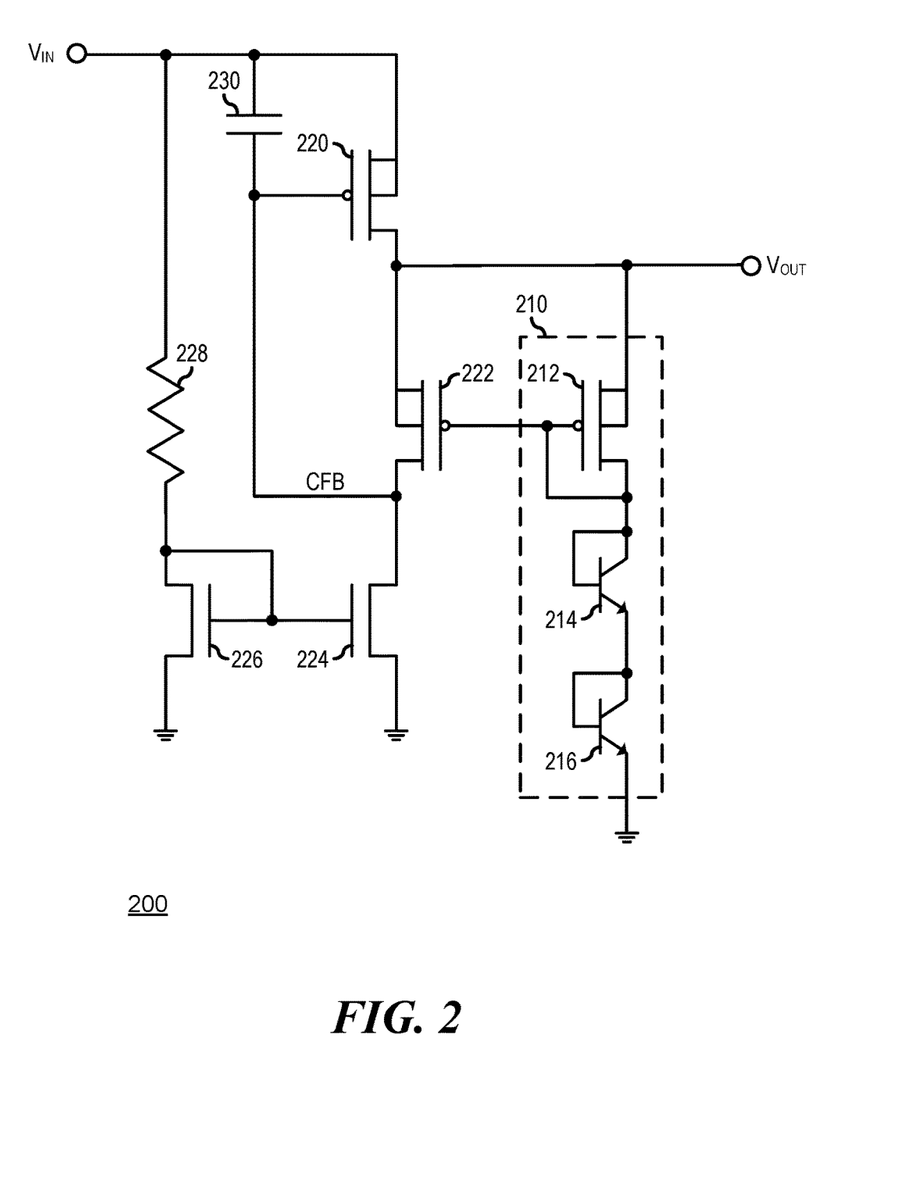
FIG. 2 is a schematic diagram illustrating an IC device having a current regulator similar to the current regulator of FIG. 1, according to another embodiment of the present application.

FIG. 2 illustrates another embodiment of a current regulator 200 similar to current regulator 120. Current regulator 200 is configured to receive an input voltage $V_{IN}$ and to provide an output voltage $V_{OUT}$. The input voltage $V_{IN}$ can be provided by a voltage regulator such as voltage regulator 110, and can exhibit unwanted noise components. The output voltage $V_{OUT}$ can be provided to a load such as load 130. Current regulator 200 can be provided as a portion of an IC device such as IC device 100, as a stand-alone module, or as a portion of a voltage regulator, as needed or desired. As described above, the voltage regulator may include a load feedback input that senses the voltage level of the voltage $V_{OUT}$, or that senses a load current drawn by the load, and may provide the regulated voltage $V_{IN}$ based upon the feedback input, as is known in the art.

Current regulator 200 operates similarly to current regulator 120 to detect noise in an output voltage $V_{OUT}$ at the voltage output of the current regulator, and to isolate an input voltage $V_{IN}$ at the voltage input of the current regulator from the output noise. Current regulator 200 includes a voltage clamp 210, PMOS FETs 220 and 222, NMOS FETs 224 and 226, a resistor 228, and a capacitor 230. Voltage clamp 210 includes a PMOS FET 212, and diodes 214 and 216. FETs 212, 220, 222, 224, and 226 each include a source electrode, a gate electrode, and a drain electrode. The source electrode of PMOS FET 220 is connected to a first electrode of capacitor 230 and is connected to receive the input voltage $V_{IN}$ at a voltage input of current regulator 200. The gate electrode of PMOS FET 222 is connected to a second electrode of capacitor 230 and is connected to receive a current feedback signal CFB from the drain electrode of PMOS FET 222, as described below. The drain electrode of PMOS FET 220 is connected to provide the output voltage $V_{OUT}$ at the voltage output of current regulator 200. The source electrode of PMOS FET 212 is connected to the drain electrode of PMOS FET 220 to detect noise on the output voltage $V_{OUT}$, as described below. The gate electrode of PMOS FET 212 is connected to the drain electrode of PMOS FET 212 to provide a current follower input to the gate electrode of PMOS FET 222, and the gate and drain electrodes of PMOS FET 212 are connected to a cathode of diode 214. An anode of diode 214 is connected to a cathode of diode 216, and an anode of diode 216 is connected to a ground plane. In a particular embodiment, diodes 214 and 216 each provide a nominal 0.7 volt rise from cathode to anode, and PMOS FET 212 provides a nominal 1.1 volt rise from drain to source $V_{DS}$. As such, the output voltage $V_{OUT}$ is clamped to 2.5 volts relative to the ground plane. As a result, clamp circuit 210 provides a variable current based upon the voltage level of the output voltage $V_{OUT}$.

A first electrode of resistor 228 is connected to the input voltage VIN, and a second electrode of the resistor is connected to the drain electrode and the gate electrode of NMOS FET 226 to provide a current follower input to the gate electrode of NMOS FET 224. The source electrode of NMOS FET 226 is connected to the ground plane. The source electrode of PMOS FET 222 is connected to the drain electrode of PMOS FET 220, and the drain electrode of PMOS FET 222 is connected to the drain electrode of NMOS FET 224. The source electrode of NMOS FET 224 is connected to the ground plane. The drain electrode of PMOS FET 222 is also connected to the second electrode of capacitor 230 to provide a current feedback signal CFB to the gate electrode of PMOS FET 220.

Current regulator 200 constitutes a high performance isolator between the input voltage $V_{IN}$ and the output voltage $V_{OUT}$, operating to detect noise in the output voltage $V_{OUT}$ at the voltage output of the current regulator, and to isolate the input voltage $V_{IN}$ at the voltage input of the current regulator from the output noise. Here, $V_{IN}=V_{OUT} V_{DS}$, where $V_{DS}$ is the voltage drop across PMOS FET 220, and in order to maintain the input voltage $V_{IN}$ at a constant voltage level, the voltage drop across PMOS FET 220 $V_{DS}$ is modulated to compensate for noise in the output voltage $V_{OUT}$. For example, if there is a voltage spike in the output voltage $V_{OUT}$, such that $V_{OUT2} > V_{OUT1}$, then, in order maintain $V_{IN}$ at the desired voltage level, the voltage drop across PMOS FET 220 $V_{DS}$ must decrease, such that $V_{DS2} < V_{DS}$. Similarly, if there is a voltage droop in the output voltage $V_{OUT}$, such that $V_{OUT2} < V_{OUT1}$, then, in order maintain $V_{IN}$ at a constant level, the voltage drop across PMOS FET 220 $V_{DS}$ must increase, such that $V_{DS2} > V_{DS1}$. As such, current regulator 200 operates to modulate the voltage drop across PMOS FET 220 in response to the detected noise in the output voltage $V_{OUT}$ at the voltage output of the current regulator. In this way, the input voltage $V_{IN}$ is less noisy than the output voltage $V_{OUT}$.

Resistor 228 and NMOS FET 226 operate to establish a constant bias current (approximately 2 μA) that is mirrored in NMOS FET 224. The constant bias current flowing through PMOS FET 222 is similar to constant current source 129 of FIG. 1, and PMOS FET 222 is similar to PMOS FET 128 of FIG. 1. As such, the constant bias current provided by NMOS FET 224 flows in PMOS FET 222 and is also mirrored in PMOS FET 212. Here, voltage clamp 210 operates similarly to noise detector 124, PMOS FET 126, and current source 127 of FIG. 1 to detect noise on the output voltage $V_{OUT}$ at the voltage output of current regulator 200, and to produce a noise-varying current in PMOS FET 212. The noise-varying current in PMOS FET 212 is mirrored in PMOS FET 222. However, because NMOS FET 224 provides the constant bias current, the changing current in PMOS FET 222 is provided as a current feedback signal CFB to PMOS FET 220 to modulate the voltage drop across PMOS FET 222.

For example, when voltage clamp 210 detects a voltage spike in the output voltage $V_{OUT}$ to a higher level than the nominal voltage level, the current through PMOS FET 212 is increased. The increased current through PMOS FET 212 is mirrored in PMOS FET 222, and the excess current in PMOS FET 222 is provided in the current feedback signal CFB to capacitor 230, which causes a rise in a voltage at the gate of PMOS FET 220, thereby reducing voltage across PMOS FET 220 $V_{DS}$, and thereby isolating the input voltage $V_{IN}$ from the voltage spike on the output voltage $V_{OUT}$. Similarly, when voltage clamp 210 detects a voltage droop in the output voltage $V_{OUT}$ to a lower level than the nominal voltage level, the current through PMOS FET 212 is decreased. The decreased current through PMOS FET 212 is mirrored in PMOS FET 222. Here, the deficiency in the current through PMOS FET 222 is provided from capacitor 230 to the current feedback signal CFB, which causes a fall in a voltage at the gate of PMOS FET 220, thereby increasing voltage across PMOS FET 220 $V_{DS}$, and thereby isolating the input voltage $V_{IN}$ from the voltage droop on the output voltage $V_{OUT}$.

Figure 3:
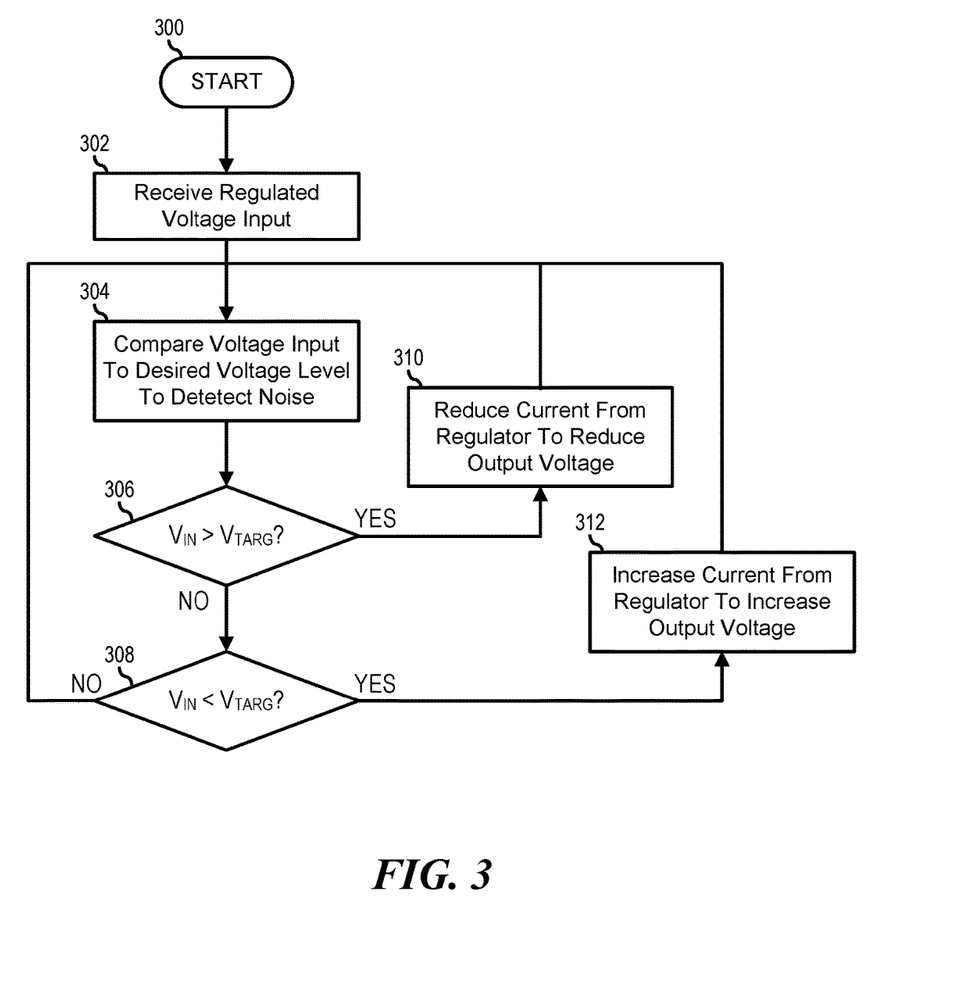
FIG. 3 is a flowchart illustrating a method for providing current and voltage regulation to improve electromagnetic compatibility performance operation of an IC device, according to a specific embodiment of the present application.

FIG. 3 illustrates a method for providing current and voltage regulation to improve electromagnetic compatibility performance operation of an IC device, starting at block 300. A regulated voltage input is received by a current regulator in block 302. For example, current regulator 120 can receive the input voltage $V_{IN}$ from voltage regulator 110. The regulated voltage input may be provided by one of several types of voltage regulation circuits, including linear regulator circuits, switching regulator circuits, or other regulator circuits, as needed or desired.

The regulated voltage input is compared to a desired output voltage level from the current regulator to detect noise on the regulated voltage in block 304. For example, depending on the type of voltage regulator that provides the regulated voltage input, the voltage input may exhibit various noise components, such as voltage transients due to a noisy source voltage provided to the voltage regulator, noise induced by switching transients in the components of the voltage regulator, noise induced onto a power trace into the current regulator, or other noise. In a particular embodiment, the regulated voltage can be compared to the desired voltage by a noise detector similar to noise detector 124 as described above. In another embodiment, the regulated voltage can be compared to the desired voltage by a voltage clamp circuit similar to voltage clamp 210 as described above. In yet another embodiment, another mechanism or method for comparing the regulated voltage to the desired voltage can be utilized, as needed or desired.

A decision is made as to whether or not the regulated voltage is greater than the desired voltage (shown as $V_{TARG}$) in decision block 306. If not, the "NO" branch of decision block 306 is taken and the method proceeds to decision block 308, as described below. If the regulated voltage is greater than the desired voltage, the "YES" branch of decision block 306 is taken and the method proceeds to block 310 where the current from the regulated voltage input is reduced to reduce the output voltage of the current regulator to the desired voltage. Here, for example, a PMOS FET, such as one of PMOS FETs 122 or 220, can have a gate voltage increased in response to the determination that the regulated voltage is greater than the desired voltage, thereby reducing the current in the PMOS FET. The method then returns to block 304, where the regulated voltage input is compared to a desired output voltage level from the current regulator to detect noise on the regulated voltage, as described above.

Returning to decision block 306, if the regulated voltage is not greater than the desired voltage, the "NO" branch of decision block 306 is taken and the method proceeds to decision block 308, where a decision is made as to whether or not the regulated voltage is less than the desired voltage. If not, the "NO" branch of decision block 306 is taken and the method returns to block 304, where the regulated voltage input is compared to a desired output voltage level from the current regulator to detect noise on the regulated voltage, as described above. If the regulated voltage is less than the desired voltage, the "YES" branch of decision block 308 is taken and the method proceeds to block 312 where the current from the regulated voltage input is increased to increase the output voltage of the current regulator to the desired voltage. Here, for example, a PMOS FET, such as one of PMOS FETs 122 or 220, can have a gate voltage decreased in response to the determination that the regulated voltage is less than the desired voltage, thereby increasing the current in the PMOS FET. The method then returns to block 304, where the regulated voltage input is compared to a desired output voltage level from the current regulator to detect noise on the regulated voltage, as described above.

According to an embodiment of the present application, a current regulator circuit to improve electromagnetic compatibility performance operation of an IC device is provided. The current regulator circuit comprises an input to receive a regulated voltage signal; an output to provide an output voltage at a desired voltage level, the output voltage exhibiting noise from a load (130); a first field effect transistor FET including a first source electrode coupled to the input, a first drain electrode coupled to the output, and a first gate electrode; a voltage clamp circuit coupled to the output, the voltage clamp circuit configured to conduct a varying current based upon the noise; a constant current source to provide a constant current; and a second FET including a second source electrode coupled to the output, a second drain electrode coupled to the constant current source and to the first gate electrode, and a second gate electrode coupled to the voltage clamp circuit to mirror the varying current in the second FET.

According to an example, the current regulator circuit further comprises a capacitor including a first electrode coupled to the input and a second electrode coupled to the first gate electrode. According to an example, the constant current source further comprises a resistor including a first electrode coupled to the input, and a second electrode; a third FET including a third drain electrode connected to the second electrode of the resistor, a third source electrode connected to a ground plane, and a third gate electrode connected to the third drain electrode; and a fourth FET including a fourth drain electrode connected to the second drain electrode, a fourth source electrode connected to the ground plane, and a fourth gate electrode connected to the third gate electrode, the resistor and the third FET to provide a constant current level that is mirrored in the fourth FET. According to an example, the voltage clamp circuit is configured to provide an increased current when the noise drives the regulated voltage signal above the desired voltage level. According to an example, the mirrored current in the second FET is increased when the noise drives the regulated voltage signal above the desired voltage level. According to an example, a current in the first FET is decreased when the noise drives the regulated voltage signal above the desired voltage level. According to an example, the voltage clamp circuit is configured to provide a decreased current when the noise drives the regulated voltage signal below the desired voltage level. According to an example, the mirrored current in the second FET is decreased when the noise drives the regulated voltage signal below the desired voltage level. According to an example, a current in the first FET is increased when the noise drives the regulated voltage signal below the desired voltage level. According to an example, the voltage clamp circuit is further configured to clamp the output voltage to the desired voltage level.

According to an embodiment of the present application, a method for providing current and voltage regulation to improve electromagnetic compatibility performance operation of an IC device is provided. The method comprises providing, at an output of a current regulator circuit, a voltage signal, the voltage signal exhibiting noise from a load; comparing a voltage level of the voltage signal to the desired voltage level to determine a first noise level; modulating a regulation current on the output based upon the comparison of the voltage level of the voltage signal to the desired voltage level; and providing a current regulated voltage signal on the output based upon the regulation current, wherein the current regulated voltage signal isolates an input of the current regulator from the first noise level.

According to an example, in modulating the regulation current on the output, the method further comprises determining that the voltage level of the regulated voltage signal is greater than the desired voltage level. According to an example, in modulating the regulation current on the output, the method further comprises reducing a current of the current regulated voltage signal in response to determining that the voltage level of the regulated voltage signal is less than the desired voltage level. According to an example, in modulating the regulation current on the output, the method further comprises determining that the voltage level of the regulated voltage signal is less than the desired voltage level. According to an example, in modulating the regulation current on the output, the method further comprises increasing a current of the current regulated voltage signal in response to determining that the voltage level of the regulated voltage signal is less than the desired voltage level.

According to an embodiment of the present application, an integrated circuit device is provided, which comprises a voltage regulator to provide a regulated voltage signal; a load to receive a current regulated voltage signal, the current regulated voltage signal being provided at a desired voltage level and includes a first noise level; and a current regulator including an input to receive the regulated voltage signal from the voltage regulator and to provide the current regulated voltage signal to the load. The current regulator is configured to compare a voltage level of the current regulated voltage signal to the desired voltage level to determine the first noise level; to modulate a regulation current on an output of the current regulator circuit based upon the comparison of the voltage level of the regulated voltage signal to the desired voltage level; and to provide the current regulated voltage signal on the output based upon the regulation current, wherein the current regulated voltage signal includes a second noise level that is lower than the first noise level. According to an example, in modulating the regulation current on the output, the current regulator is further configured to determine that the voltage level of the regulated voltage signal is greater than the desired voltage level. According to an example, in modulating the regulation current on the output, the current regulator is further configured to reduce a current of the current regulated voltage signal in response to determining that the voltage level of the regulated voltage signal is greater than the desired voltage level. According to an example, in modulating the regulation current on the output, the current regulator is further configured to determine that the voltage level of the regulated voltage signal is less than the desired voltage level. According to an example, in modulating the regulation current on the output, the current regulator is further configured to increase a current of the current regulated voltage signal in response to determining that the voltage level of the regulated voltage signal is less than the desired voltage level.

The preceding description in combination with the Figures was provided to assist in understanding the teachings disclosed herein. The discussion focused on specific implementations and embodiments of the teachings. This focus was provided to assist in describing the teachings, and should not be interpreted as a limitation on the scope or applicability of the teachings. However, other teachings can certainly be used in this application. The teachings can also be used in other applications, and with several different types of architectures.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

LIST OF REFERENCE SIGNS

100: IC device;
110: voltage regulator;
120: current regulator;
122: PMOS FET;
123: capacitor;
124: noise detector;
126: PMOS FET;
127: current source;
128: PMOS FET;
129: current source;
130: load;
200: current regulator;
210: voltage clamp;
212: PMOS FET;
214: diode;
216: diode;
220: PMOS FET;
222: PMOS FET;
224: NMOS FET;
226: NMOS FET;
228: resistor;
230: capacitor;

What is claimed is:

1. A current regulator circuit to improve electromagnetic compatibility performance operation of an IC device, the current regulator circuit comprising:
   an input to receive a regulated voltage signal;
   an output to provide an output voltage at a desired voltage level, the output voltage exhibiting noise from a load;
   a first field effect transistor FET including a first source electrode coupled to the input, a first drain electrode coupled to the output, and a first gate electrode;
   a voltage clamp circuit coupled to the output, the voltage clamp circuit configured to conduct a varying current based upon the noise;
   a constant current source to provide a constant current; and
   a second FET including a second source electrode coupled to the output, a second drain electrode coupled to the constant current source and to the first gate electrode, and a second gate electrode coupled to the voltage clamp circuit to mirror the varying current in the second FET.

2. The current regulator circuit of claim 1, further comprising:
   a capacitor including a first electrode coupled to the input and a second electrode coupled to the first gate electrode.

3. The current regulator circuit of claim 1, wherein the constant current source comprises:
   a resistor including a first electrode coupled to the input, and a second electrode;
   a third FET including a third drain electrode connected to the second electrode of the resistor, a third source electrode connected to a ground plane, and a third gate electrode connected to the third drain electrode; and
   a fourth FET including a fourth drain electrode connected to the second drain electrode, a fourth source electrode connected to the ground plane, and a fourth gate electrode connected to the third gate electrode, the resistor and the third FET to provide a constant current level that is mirrored in the fourth FET.

4. The current regulator circuit of claim 1, the voltage clamp circuit configured to provide an increased current when the noise drives the regulated voltage signal above the desired voltage level.

5. The current regulator circuit of claim 4, the mirrored current in the second FET being increased when the noise drives the regulated voltage signal above the desired voltage level and/or a current in the first FET being decreased when the noise drives the regulated voltage signal above the desired voltage level.

6. The current regulator circuit of claim 1, the voltage clamp circuit configured to provide a decreased current when the noise drives the regulated voltage signal below the desired voltage level.

7. The current regulator circuit of claim 1, the mirrored current in the second FET being decreased when the noise drives the regulated voltage signal below the desired voltage level.

8. The current regulator circuit of claim 7, a current in the first FET being increased when the noise drives the regulated voltage signal below the desired voltage level.

9. The current regulator circuit of claim 1, the voltage clamp circuit being further configured to clamp the output voltage to the desired voltage level.

10. A method for providing current and voltage regulation to improve electromagnetic compatibility performance operation of an IC device, the method comprising:
    providing, at an output of a current regulator circuit, a voltage signal, the voltage signal exhibiting noise from a load;
    comparing a voltage level of the voltage signal to a desired voltage level to determine a first noise level;
    modulating a regulation current on the output based upon the comparison of the voltage level of the voltage signal to the desired voltage level; and
    providing a current regulated voltage signal on the output based upon the regulation current using a constant current source to provide a constant current and a FET that includes a source electrode coupled to the output, a drain electrode coupled to the constant current source, and a gate electrode coupled to a voltage clamp circuit.

11. The method of claim 10, wherein, in modulating the regulation current on the output, the method further comprises:
    determining that the voltage level of the regulated voltage signal is greater than the desired voltage level.

12. The method of claim 11, wherein, in modulating the regulation current on the output, the method further comprises:
    reducing a current of the current regulated voltage signal in response to determining that the voltage level of the regulated voltage signal is less than the desired voltage level.

13. The method of claim 10, wherein, in modulating the regulation current on the output, the method further comprises:
    determining that the voltage level of the regulated voltage signal is less than the desired voltage level.

14. The method of claim 13, wherein, in modulating the regulation current on the output, the method further comprises:
    increasing a current of the current regulated voltage signal in response to determining that the voltage level of the regulated voltage signal is less than the desired voltage level.

15. An integrated circuit device, comprising:
a voltage regulator to provide a regulated voltage signal;
a load to receive a current regulated voltage signal, the current regulated voltage signal being provided at a desired voltage level and includes a first noise level; and
a current regulator including an input to receive the regulated voltage signal from the voltage regulator and to provide the current regulated voltage signal to the load, the current regulator configured to:
   compare a voltage level of the current regulated voltage signal to the desired voltage level to determine the first noise level;
   modulate a regulation current on an output of the current regulator circuit based upon the comparison of the voltage level of the regulated voltage signal to the desired voltage level using a constant current source to provide a constant current and a FET that includes a source electrode coupled to the output, a drain electrode coupled to the constant current source, and a gate electrode coupled to a voltage clamp circuit; and
   provide the current regulated voltage signal on the output based upon the regulation current, wherein the current regulated voltage signal includes a second noise level that is lower than the first noise level.

16. The integrated circuit device of claim 15, wherein, in modulating the regulation current on the output, the current regulator further:
   determines that the voltage level of the regulated voltage signal is greater than the desired voltage level.

17. The integrated circuit device of claim 15, wherein, in modulating the regulation current on the output, the current regulator further:
   reduces a current of the current regulated voltage signal in response to determining that the voltage level of the regulated voltage signal is greater than the desired voltage level.

18. The integrated circuit device of claim 15, wherein, in modulating the regulation current on the output, the current regulator further:
   determines that the voltage level of the regulated voltage signal is less than the desired voltage level.

19. The integrated circuit device of claim 15, wherein, in modulating the regulation current on the output, the current regulator further:
   increases a current of the current regulated voltage signal in response to determining that the voltage level of the regulated voltage signal is less than the desired voltage level.

* * * * *